(12) United States Patent
Alok

(10) Patent No.: US 6,593,594 B1
(45) Date of Patent: Jul. 15, 2003

(54) SILICON CARBIDE N-CHANNEL POWER LMOSFET

(75) Inventor: Dev Alok, Danbury, CT (US)

(73) Assignee: Koninklijke Philips Electonics N.V., Eindhoven (NL)

( * ) Notice: Subject to any disclaimer, the term of this patent is extended or adjusted under 35 U.S.C. 154(b) by 0 days.

(21) Appl. No.: 09/469,450

(22) Filed: Dec. 21, 1999

(51) Int. Cl.$^7$ .................. H01L 31/0312; H01L 29/76; H01L 29/94; H01L 31/113; H01L 31/119
(52) U.S. Cl. .................. 257/77; 257/339; 257/343
(58) Field of Search .................. 257/343, 335, 257/339, 77, 288

(56) References Cited

U.S. PATENT DOCUMENTS

| | | | | |
|---|---|---|---|---|
| 5,068,700 A | * | 11/1991 | Yamaguchi et al. | 257/212 |
| 5,286,995 A | * | 2/1994 | Malhi | 257/409 |
| 5,448,081 A | | 9/1995 | Malhi | 257/77 |
| 5,627,385 A | | 5/1997 | Bhatnagar et al. | 257/77 |
| 5,801,431 A | * | 9/1998 | Ranjan | 257/659 |
| 5,923,051 A | | 7/1999 | Harris et al. | 257/77 |
| 6,211,552 B1 | * | 4/2001 | Effand et al. | 257/343 |
| 6,242,787 B1 | * | 6/2001 | Nakayama et al. | 257/493 |
| 6,252,278 B1 | * | 6/2001 | Hsing | 257/335 |

FOREIGN PATENT DOCUMENTS

| | | | |
|---|---|---|---|
| EP | 0069429 A2 | * 1/1993 | .......... H01L/29/06 |
| JP | 01243472 A | 9/1989 | |
| JP | 08088283 A | 4/1996 | |

OTHER PUBLICATIONS

"Process Dependence of Inversion Layer Mobility in 4H–SiC Devices", by Dev Alok et al., Oct. 1999.

* cited by examiner

*Primary Examiner*—Shouxiang Hu
(74) *Attorney, Agent, or Firm*—Steven R. Biren

(57) ABSTRACT

A lateral metal-oxide-semiconductor field effect transistor (LMOSFET) includes a layer of silicon carbide semiconductor material having a p-type conductivity, source and drain regions having n-type conductivities disposed in the silicon carbide semiconductor layer, and an insulated gate electrode disposed on the silicon carbide semiconductor layer. A silicon carbide semiconductor substrate having an n-type conductivity, supports the silicon carbide semiconductor layer. A second layer of silicon carbide semiconductor material having a p-type conductivity, is disposed between the substrate and the first silicon carbide semiconductor layer to prevent parasitic transistor effects. A sinker region having an n-type conductivity extends from the source contact to the silicon carbide semiconductor substrate to ground the substrate.

6 Claims, 2 Drawing Sheets

SILICON CARBIDE N-CHANNEL POWER LMOSFET

RELATED APPLICATIONS

Commonly-assigned, U.S. patent application Ser. No. 09/469,454, entitled "Self-Aligned Silicon Carbide LMOSFET", filed on Dec. 21, 1999, now U.S. Pat. No. 6,323,506.

Commonly-assigned, U.S. patent application Ser. No. 09/469,451, entitled "Silicon Carbide LMOSFET With Gate Reach-through Protection", filed on Dec. 21, 1999, now U.S. Pat. No. 6,355,944.

FIELD OF THE INVENTION

This invention relates to lateral metal-oxide-semiconductor field effect transistors (LMOSFETs) used in high-power applications such as UHF transmission which are especially suited for silicon carbide (SiC) technology. In particular, the invention relates to an n-channel SiC power LMOSFET built on a highly-doped n-type SiC substrate, wherein a highly-doped n-type sinker provides a grounding path to the highly-doped n-type substrate, a highly-doped p-type buffer layer is provided to ensure against parasitic NPN transistor losses, and a lightly-doped p-type epitaxial layer provides a channel region for the device.

BACKGROUND OF THE INVENTION

In recent years, the use of silicon lateral double-diffused metal-oxide-semiconductor field effect transistors (Si LDMOSFETs) in high-power applications such as cellular and UHF broadcast transmission has increased enormously. This is because Si LDMOSFETs offer higher gain and better linearity than bipolar devices.

It is desirable to fabricate these power Si LDMOSFETs with n-channel structures and grounded substrates to reduce parasitic effects. As shown in FIG. 1, this is typically achieved by fabricating a power Si LDMOSFET 10 with a highly doped p-type substrate 12 and a highly doped p-type diffusion or sinker 14 which grounds the substrate 12 in order to desirably reduce parasitic effects.

Silicon carbide (SiC) is an attractive semiconductor material for high frequency and high power applications. The properties which make SiC attractive for high power UHF applications are its large critical electric field (10 times that of Si) and its large electron saturation velocity (2 times that of Si). The large critical electric field helps increase the breakdown voltage of the device and the large saturation velocity helps increase the peak current.

Theoretically, it should be possible to achieve power densities which are 20 times higher than that of Si LDMOS-FETs with comparable feature sizes in SiC LDMOSFETs. The operating frequency and gain should be similar for both Si and SiC devices with comparable gate lengths. Hence, it would be desirable to fabricate the LDMOSFET structure shown in FIG. 1 in SiC instead of Si.

Unfortunately, there are many practical difficulties in achieving such an n-channel LDMOSFET structure in SiC. It is not possible to diffuse the dopants in SiC thus only high energy ion implantation can be used to fabricate deep p-type sinkers. However, these p-type implanted SiC layers have very high resistivities. The lowest reported sheet resistance to date for implanted p-type layers is about 10 k$\Omega$/sq (all sheet resistance data discussed herein is at 20° C.) This data suggests that it will not be possible to form low resistivity highly doped p-type sinkers in SiC.

Another difficulty in achieving the MOSFET structure shown in FIG. 1 in SiC relates to the very high resistivities of SiC p-type substrates. The resistivity of p-type SiC substrates is only about 5 $\Omega$/sq. In comparison, p-type Si substrates used in Si LDMOSFETs have resistivities as low as about 0.014 $\Omega$/sq.

Still another difficulty in achieving the FIG. 1 MOSFET structure in SiC concerns the formation of the channel of the device. In Si n-channel LDMOSFETs, the channel is formed via an inversion region 18, in an implanted p-type layer 16 (P base) as shown in FIG. 1. This may not be practical to do in SiC devices because the inversion region formed in the implanted surface of a SiC p-type epilayer results in very low inversion layer mobility (less than about 1 cm$^2$/Vs). Inversion layer mobilities higher than about 100 cm$^2$/Vs have only been achieved on epitaxial p-type SiC layers as reported by Alok et al., "Process Dependence of Inversion Layer Mobility in 4H—SiC Devices", at the International Conference on Silicon Carbide and Related Materials in Raleigh, (N.C.) in October 1999.

One possible solution to the substrate grounding problem in n-channel SiC MOSFET devices is to use a p-channel structure in the device with an n-type SiC substrate. The resistivity of n-type SiC substrates and implanted layers is about 2 orders-of-magnitudes lower than that of p-type in SiC. The lowest sheet resistance of implanted n-type SiC layers is about 200 $\Omega$/sq and the lowest sheet resistance of n-type SiC substrate is about 0.02 $\Omega$/sq. However, p-channel SiC MOSFETs are affected by hole mobilities which are two orders-of-magnitude lower than electron mobilities.

Therefore, an n-channel SiC power lateral MOSFET structure is needed which overcomes the above problems.

SUMMARY OF THE INVENTION

A lateral metal-oxide-semiconductor field effect transistor (LMOSFET) comprising a layer of silicon carbide semiconductor material having a p-type conductivity, source and drain regions having n-type conductivities disposed in the silicon carbide semiconductor layer, and an insulated gate electrode disposed on the silicon carbide semiconductor layer. A silicon carbide semiconductor substrate having an n-type conductivity, supports the p-type conductivity silicon carbide semiconductor layer.

One aspect of the invention involves providing a sinker region having an n-type conductivity, in the silicon carbide p-type semiconductor layer. The sinker region extends from the source contact to the silicon carbide semiconductor substrate to ground the substrate.

Another aspect of the invention involves providing a second layer of silicon carbide semiconductor material having a p-type conductivity, between the substrate and the first silicon carbide semiconductor layer. The second layer of silicon carbide prevents parasitic transistor effects.

BRIEF DESCRIPTION OF THE DRAWINGS

The advantages, nature, and various additional features of the invention will appear fully upon consideration of the illustrative embodiment now to be described in detail in connection with accompanying drawings wherein.

DETAILED DESCRIPTION OF THE INVENTION

Figure 1:
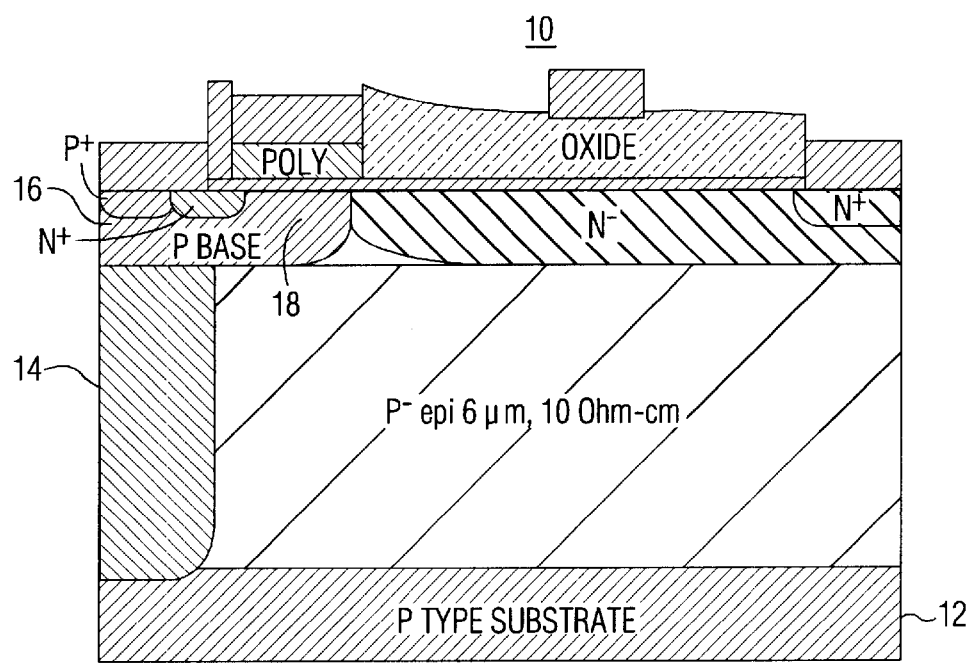
FIG. 1 is a cross-sectional view of a prior art UHF power Si LDMOSFET.
Figure 2:
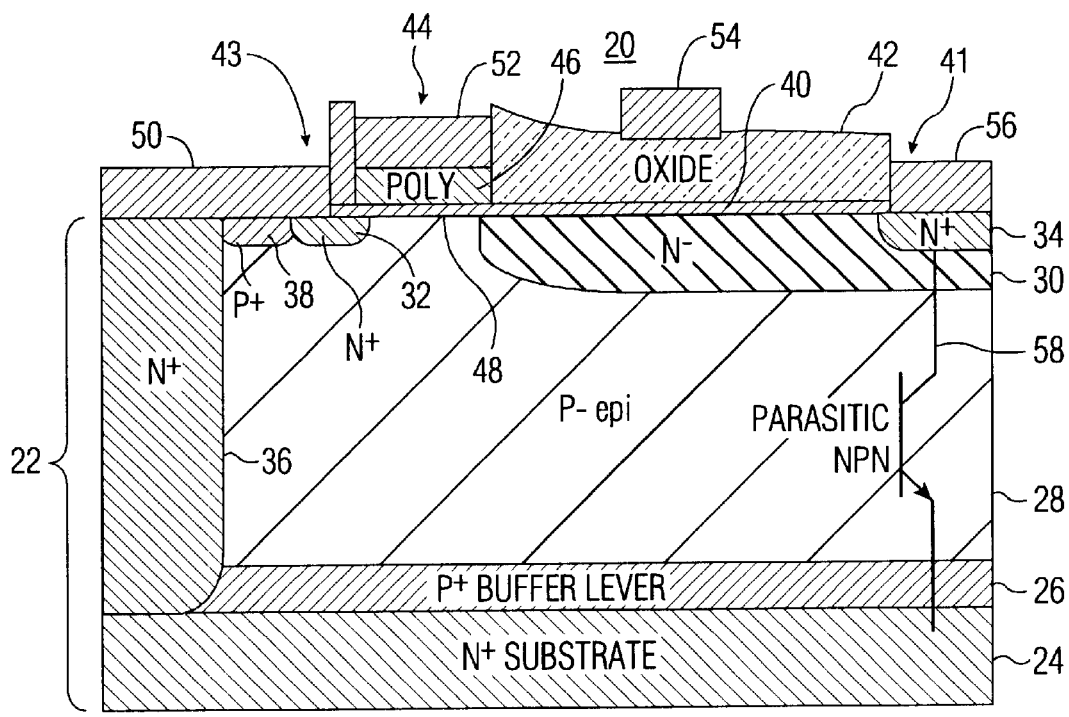
FIG. 2 is a cross-sectional view of a SiC n-channel power lateral metal-oxide-semiconductor field effect transistor device according to the invention.

FIG. 2 shows a cross-sectional view of a SiC n-channel power lateral metal-oxide-semiconductor field effect transistor (LMOSFET) 20 according to the invention. The LMOSFET 20 should provide better gain, linearity, efficiency and power density at comparable frequencies, and higher frequency operation than Si LDMOSFETs. Accordingly, the SiC LMOSFET 20 can replace Si LDMOS-FETs in UHF transmitters at 2 GHz and extend the transmission range up to at least 4 GHz.

Figure 3:
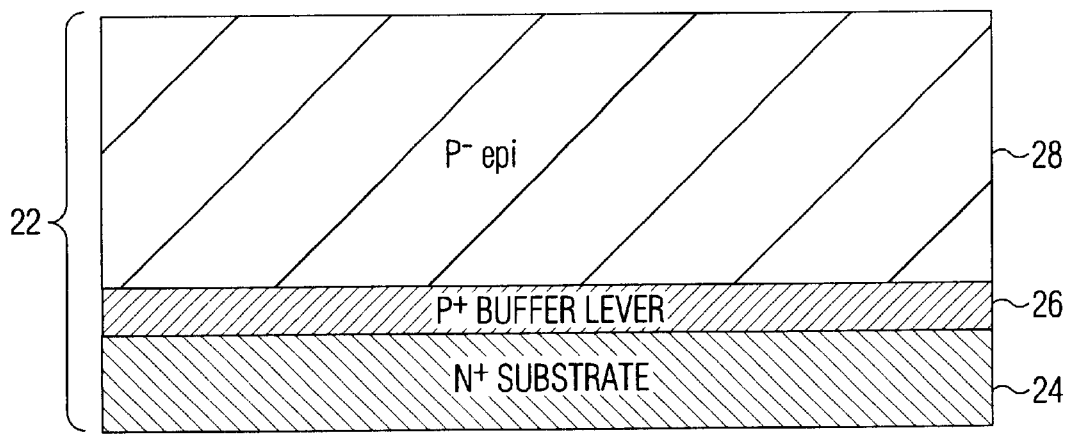
FIG. 3 is a cross-sectional view of a starting SiC wafer used for fabricating the LMOSFET device of the invention.

Referring to FIG. 3, the LMOSFET 20 is fabricated from a SiC wafer 22 that comprises a highly doped n-type SiC substrate 24 (N+ substrate) with a highly-doped p-type epitaxial SiC layer 26 (P+ epilayer) grown on top of the N+ substrate 24, and a lightly-doped p-type epitaxial SiC layer 28 (P− epilayer) grown on top of the P+ epilayer 26. The N+ substrate 24 is doped using in-situ nitrogen doping during crystal growth to provide a sheet resistance as low as about 0.02 Ω/sq. The P+ and P− epilayers 26, 28 are epitaxially grown using conventional methods such as chemical vapor deposition CVD. The P+ epilayer 26 is typically doped as high as $1 \times 10^{18}$ cm$^{-3}$ using aluminum or boron incorporation during epitaxial growth and its thickness is selected to be 5 times that of the diffusion length of electrons in this layer which is usually less than a micron. The thickness and doping of the P− epilayer 28 are selected according to the desired electrical breakdown voltage of the LMOSFET 20. The P− epilayer 28 is also doped using aluminum or boron incorporation during epitaxial growth.

Referring again to FIG. 2, the LMOSFET 20 includes a lightly n-doped drift region 30 and highly n-doped source and drain regions 32, 34 formed in the top surface of the P− epilayer 28. A highly n-doped sinker region 36 is formed in the P− and P+ epilayers 28, 26. The sinker region 36 grounds the N+ substrate of the LMOSFET 20. A highly p-doped region 38 (P+ region) is formed in the top surface of the P− epilayer 28 between the source and sinker regions 32, 36. The P+ region 38 provides ohmic contact to the P− epilayer 28.

The drift, source, drain, sinker and P+ regions 30, 32, 34, 36, 38 are formed using conventional high-energy ion implantation methods. Once electrically activated, the implanted source, drain and sinker regions 32, 34, 36 should each exhibit a low sheet resistance of about 200 Ω/sq, and the implanted P+ region 38 should exhibit a sheet resistance of about 10 kΩ/sq.

A thin layer of oxide 40 (gate oxide) such as silicon dioxide is formed on the top surface of the P− epilayer 28. The oxide layer 40 is created using deposition or thermal oxidation or a combination thereof. A polysilicon gate electrode 46 is formed on top of the oxide layer 40. The polysilicon gate electrode 46 can be formed using conventional silicon deposition and patterning methods. The gate electrode 46 extends between and partially overlaps the source and drift regions 32, 30. A second thicker layer 42 of oxide is deposited to cover the first oxide layer 40 and the gate electrode 46. Openings 41, 43, and 44 are defined in the oxide layers 40, 42 to open windows for gate, source and drain contacts. The opening 44 extends down to the gate electrode 46, whereas openings 41 and 43 extend down to the P− epilayer 28. The portion of the P-epilayer 28 extending between the source and drift regions 32, 30 underneath the gate electrode 46, defines a channel region 48. When a positive voltage greater than the threshold voltage of the LMOSFET 20 is applied to the gate electrode 46, the channel region 48 changes from p-type to n-type due to inversion thereby inducing a low resistance current path between the source 32 and the drain 34 in the LMOSFET 20.

Conventional metallic contacts 50, 52, 54, 56 are respectively formed on top of the regions 32, 38 and 36; the polysilicon gate electrode 46; the second oxide layer 42; and the drain region 34. The contacts 50, 52, and 56 operate as terminals for the LMOSFET 20. The contact 54, usually tied to source contact 50, formed on the second oxide layer 42 together with the drift region 30 define a field plate that increases the electrical breakdown voltage of the LMOSFET 20.

It should be noted that the present LMOSFET structure defines an additional parasitic NPN transistor 58 (shown schematically in FIG. 2) between the drain region 34 and the substrate 24. The P+ epilayer 26 operates as a buffer layer to ensure that this parasitic transistor 58 does not turn on.

While the foregoing invention has been described with reference to the above embodiment, various modifications and changes can be made without departing from the spirit of the invention. Accordingly, all such modifications and changes are considered to be within the scope of the appended claims.

What is claimed is:

1. A power lateral metal-oxide-semiconductor silicon carbide field effect transistor (LMOSFET) comprising:

a first silicon carbide semiconductor layer having a p-type conductivity;

n-type source and drain regions implanted in the first silicon carbide semiconductor layer;

an insulated gate electrode formed on the first silicon carbide semiconductor layer, the insulated gate electrode defining a channel region therebeneath in the first silicon carbide semiconductor layer;

source and drain electrical contacts formed on the first silicon carbide semiconductor layer, and a gate electrical contact formed on the insulated gate electrode;

a silicon carbide semiconductor substrate having an n-type conductivity, the silicon carbide semiconductor substrate supporting the first silicon carbide semiconductor layer;

a second silicon carbide semiconductor layer having a p-type conductivity, the second silicon carbide semiconductor layer being heavily doped and disposed between the silicon carbide semiconductor substrate and the first silicon carbide semiconductor layer for preventing parasitic transistor effects; and a sinker region having an n-type conductivity implanted in the first and second silicon carbide semiconductor layers, the sinker region extending from the source electrical contact to the silicon carbide semiconductor substrate thereby grounding the silicon carbide semiconductor substrate, wherein the silicon carbide semiconductor substrate has a sheet resistance of about or less than 0.02 ohm/sq.

2. The power LMOSFET according to claim 1, wherein the first and second silicon carbide semiconductor layers are epitaxial layers.

3. The power LMOSFET according to claim 1, further comprising a drift region having an n-type conductivity implanted in the first silicon carbide semiconductor layer adjacent to the channel region and the drain region.

4. The power LMOSFET according to claim 3, further comprising an electrically insulated field plate disposed on the first silicon carbide semiconductor layer and above the drift region.

5. The power LMOSFET according to claim 1, further comprising a heavily doped p-type region implanted in the first silicon carbide semiconductor layer adjacent to the source region, the heavily doped p-type region electrically coupling the first silicon carbide semiconductor layer with the source contact.

6. The power LMOSFET according to claim 1, wherein each of the sinker, source and drain regions has a sheet resistance of about or less than 200 Ohm/sq.

* * * * *